United States Patent [19]

Stein

[11] 4,209,356
[45] Jun. 24, 1980

[54] SELECTIVE ETCHING OF POLYMERIC MATERIALS EMBODYING SILICONES VIA REACTOR PLASMAS

[75] Inventor: Leonard Stein, Dewitt, N.Y.

[73] Assignee: General Electric Company, Schenectady, N.Y.

[21] Appl. No.: 952,406

[22] Filed: Oct. 18, 1978

[51] Int. Cl.[2] .................. H01L 21/306; B44C 1/22; C03C 15/00; C03C 25/06
[52] U.S. Cl. ........................... 156/643; 156/646; 156/653; 156/657; 156/662; 204/192 E; 252/79.1
[58] Field of Search .............. 156/643, 646, 650–653, 156/657, 659, 661, 662, 668; 204/192 E, 164, 298; 96/36.2, 38.4; 427/88–91; 29/591, 588; 252/79.1; 357/54, 72

[56] References Cited
U.S. PATENT DOCUMENTS

| | | | |
|---|---|---|---|
| 3,586,554 | 6/1971 | Couture et al. | 156/662 |
| 3,816,198 | 6/1974 | LaCombe | 156/643 |
| 3,994,817 | 11/1976 | Quintana | 156/662 |
| 4,140,572 | 2/1979 | Stein | 156/662 |

Primary Examiner—William A. Powell
Attorney, Agent, or Firm—Donald M. Winegar; James C. Davis, Jr.; Leo I. MaLossi

[57] ABSTRACT

Silicon is employed as a masking material for the selective plasma chemical etching of a coating material of a polyimide-silicone copolymer disposed on selective surface areas of electronic devices.

16 Claims, 6 Drawing Figures

SELECTIVE ETCHING OF POLYMERIC MATERIALS EMBODYING SILICONES VIA REACTOR PLASMAS

BACKGROUND OF THE INVENTION

1. Field of the Invention

This invention relates to the selective plasma chemical etching of polyimide-silicone copolymers for patterning thereof.

2. Description of the Prior Art

In the copending application of Abe Berger entitled "Polyimide-Silicone Copolymers For Coating Semiconductor Junctions", U.S. Ser. No. 652,092, filed Jan. 26, 1976, for the method of making the material and its application to selective surface areas of electronic devices is taught. After the copolymer material is applied to surface areas it becomes necessary on occasion to open windows in the coating and/or to remove material from selective areas. It is desirable that the removal of the unwanted portions of the copolymer material be done as quickly and as easily as possible to facilitate semiconductor device processing. It is also most desirable to maintain the registry and dimensions of the pattern.

In my copending patent application entitled "Novel Process for Selective Etching of Polymeric Materials Embodying Silicones Therein", Ser. No. 720,584, filed on Sept. 7, 1976, and now U.S. Pat. No. 4,140,572 I describe the use of titanium as a masking material for etching with a phenol-bearing solution. However, although the process is successful, one always finds a need for a more efficient process for a particular manufacturing requirement.

A novel process introduced into the semiconductor art is chemical etching by use of plasma. The plasma is an ionized gas containing a variety of highly reactive particles such, for example, as ions, free electrons and free radicals. An article entitled "A Survey of Plasma-Etching Process" appeared in *Solid State Technology*, May 1976, and describes the process.

An object of this invention is to provide a new and improved method to pattern a layer of a cured polyimide-silicone copolymer material.

Another object of this invention is to provide a new and improved method for selective plasma chemical etching of a layer of a cured polyimide-silicone copolymer material which embodies silicon as a masking material.

A further object of this invention is to provide a new and improved method for selective plasma chemical etching of a layer of a cured polyimide-silicone copolymer material which opens windows in the layer, the edges of which are substantially free of undercutting.

Other objects of this invention will, in part, be obvious and will, in part, appear hereinafter.

BRIEF SUMMARY OF THE INVENTION

In accordance with the teachings of this invention there is provided a new and improved method for patterning a layer of cured silicone-polyimide copolymer material disposed on the surface of the body. Preferably, it is a method employed when the material is disposed on the surface of a body of semiconductor material. The layer is from 1 to 10 microns in thickness. The final cure is accomplished by baking at about 450° C. A layer of silicon, preferably, of the order of 1000Å, is disposed on the copolymer material layer by electron beam deposition technique. A layer of either negative or positive photoresist material is disposed on the silicon material which is to act as a mask.

The layer of photoresist material is processed to form one or more windows therein. Selected surface areas of the layer of silicon are exposed in the windows. The exposed silicon is chemically etched by a plasma of Freon 14, which is a tradename of E. I. DuPont de Nemours & Co., Inc. for $CF_4$, containing about 4% oxygen by volume of Freon 14 for a sufficient time to open windows in the silicon layer. The windows are aligned with those in the photoresist layer thereby enabling selected surface areas of the copolymer material to be exposed in the windows. The layer of photoresist is preferably simultaneously stripped with the etching of the polyimide-silicone copolymer material.

The copolymer material is chemically etched in a plasma of oxygen. Chemical etching is performed until windows are opened in the layer to expose surface areas of the body thereat. The processed body is then cleaned, as required, and further processed into the required semiconductor device.

DESCRIPTION OF THE INVENTION

Figure 1:
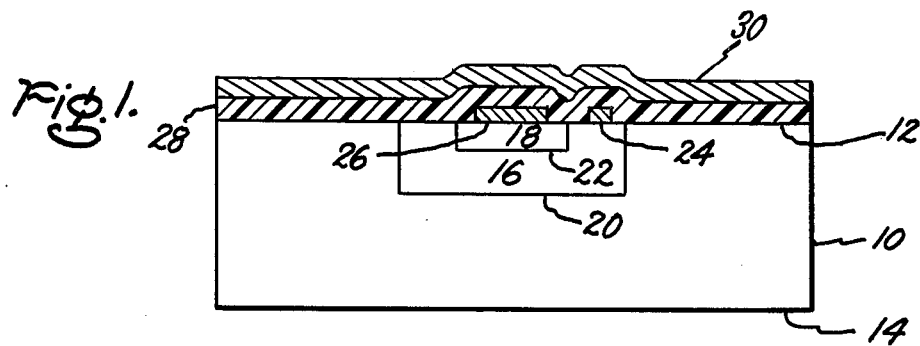
FIGS. 1 through 6 are side elevation views, partly in cross-section of a body of semiconductor material processed in accordance with the teachings of this invention.

The cured polyimide-silicone copolymer material which is to be patterned by selective etching is described in a copending patent application of Abe Berger entitled "Polyimide-Silicone Copolymers For Coating Semiconductor Junctions" and assigned U.S. Ser. No. 652,092. The method of making the material and the application of the same to selective surface areas of electrical and electronic components is incorporated herein by reference.

Briefly, the polyimide-silicone copolymer is the reaction product of a silicon-free organic diamine, an organic tetracarboxylic dianhydride and a polysiloxane diamine which is a polymer precursor soluble in a suitable organic solvent. On curing, it yields a copolymer having recurring structural units of the formula:

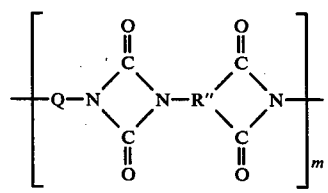

with from 5 to 40 mol percent and preferably 25 to 35 mol percent intercondensed structural units of the formula:

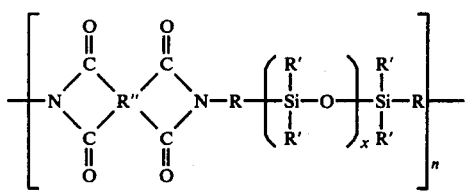

wherein R is a divalent hydrocarbon radical, R' is a monovalent hydrocarbon radical, R" is a tetravalent organic radical, Q is a divalent silicon-free organic radical which is the residue of an organic diamine, x is an integer having a value of 1-4 and m and n are different integers greater than 1, from 10 to 10,000 or more.

The above-mentioned random and block copolymers can be prepared by effecting reaction, in the proper molar proportions, of a mixture of ingredients comprising a diaminosiloxane of the general formula:

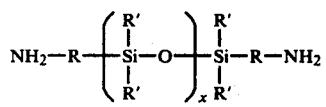

a silicon-free diamine compound of the formula:

$$NH_2—Q—NH_2 \quad \text{IV.}$$

and a tetracarboxylic acid dianhydride having the formula;

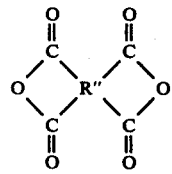

wherein R, R', R", Q and x have the meanings given above.

Alternately, a polysiloxane-imide composition may be used with comparable effectiveness by blending together a polyimide composed solely of recurring structural units of Formula I with a polyimide composed solely of recurring structural units of Formula II employing the polyimide of Formula II in such a molar proportion that the structural units of the latter are within the range of from 5 to 50 mol percent of said units based on the total molar concentration of the units of Formula II and the units of Formula I.

It will be recognized that the ultimate polyimide siloxane composition used in the practice of this invention will consist essentially of the imido structures found in Formulas I and II. However, the actual precursor materials resulting from the reaction of the diaminosiloxane, the silicon-free organic diamine and the tetracarboxylic acid dianhydride will initially be in the form of a polyamic acid structure composed of structural units of the formulas:

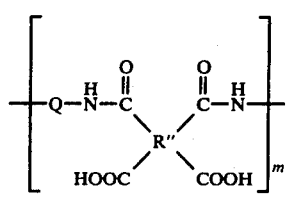

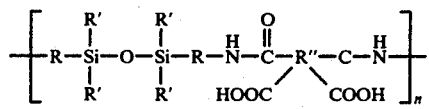

where R, R', R", Q, x, m and n have the meanings given above.

The diamino siloxanes of Formula III which may be used in the practice of the present invention include compounds having the following formulas:

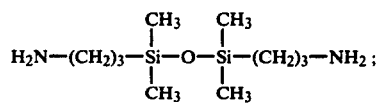

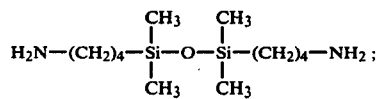

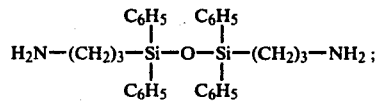

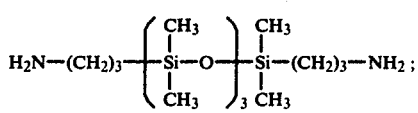

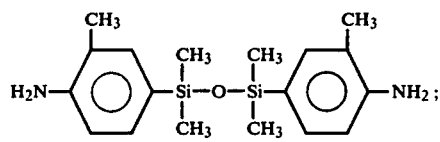

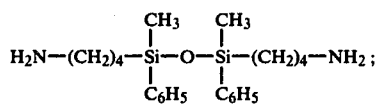

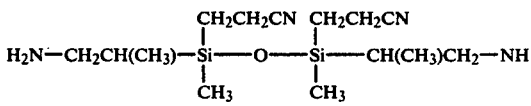

and the like.

The diamines of Formula IV above are described in the prior art and are to a large extent commercially available materials. Typical of such diamines from which the prepolymer may be prepared are the following:

m-phenylenediamine;
p-phenylenediamine;
4,4'-diaminodiphenylpropane;
4,4'-diaminodiphenylmethane;

4,4'-methylenedianiline;
benzidine;
4,4'-diaminodiphenyl sulfide;
4,4'-diaminodiphenyl sulfone;
4,4'-diaminodiphenyl ether;
1,5-diaminophthalene;
3,3'-dimethylbenzidine;
3,3'-dimethoxybenzidine;
2,4-bis(β-amino-t-butyl)toluene;
bis(p-β-amino-t-butylphenyl)ether;
bis(p-β-methyl-o-aminopentyl)benzene; 1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
actamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
N-methyl-bis(3-aminopropyl)amine;
hexamethylenediamine;
heptamethylenediamine;
nonamethylenediamine;

and mixtures thereof. It should be noted that these diamines are given merely for the purpose of illustration and are not considered to be all inclusive. Other diamines not mentioned will readily be apparent to those skilled in the art.

The tetracarboxylic acid dianhydrides of Formula V may further be defined in that the R" is a tetravalent radical, e.g. a radical derived from or containing an aromatic group containing at least 6 carbon atoms characterized by benzenoid unsaturation, wherein each of the 4 carbonyl groups of the dianhydride are attached to a separate carbon atom in the tetravalent radical, the carbonyl groups being in pairs in which the groups in each pair are attached to adjacent carbon atoms of the R" radical or to carbon atoms in the R" radical at most one carbon atom removed, to provide a 5-membered or 6-membered ring as follows:

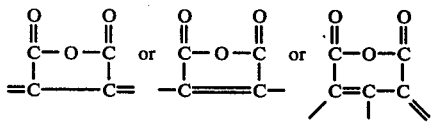

Illustration of dianhydrides suitable for use in the present invention (with their reference acronym designated in parenthesis) include:

2,3,6,7-napthalene tetracarboxylic dianhydride;
3,3',4,4'-diphenyl tetracarboxylic dianhydride;
1,2,5,6-napthalene tetracarboxylic dianhydride;
2,2',3,3'-diphenyl tetracarboxylic dianhydride;
2,2-bis(3,4-dicarboxyphenyl)propane dianhydride;
bis(3,4-dicarboxyphenyl)sulfone dianhydride;
2,2-bis[4-(3,4-dicarboxyphenoxy)phenyl]propane dianhydride (BPA dianhydride);
2,2-bis[4-(2,3-dicarbocyphenoxy)phenyl]propane dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl)methane dianhydride;

and aliphatic anhydrides such as cyclopentane tetracarboxylic dianhydride, cyclohexane tetracarboxylic dianhydride, butane tetracarboxylic dianhydride, etc. The incorporation of other anhydrides, such as trimellitic anhydride, to make amide-imide-siloxane polymers is not precluded.

Application of the random or block copolymers or blends of polymers in a suitable solvent (including, for example, N-methylpyrrolidone, N,N-dimethylacetamide, N,N-dimethylformamide, etc.) alone or combined with nonsolvents, to the substrate material may be by conventional means such as dipping, spraying, painting, spinning, etc. The block copolymers or blends of polymers may be dried in an initial heating step at temperatures of about 75 to 125° C. for a sufficient time frequently under vacuum to remove the solvent. The polyamic acid is then converted to the corresponding polyimide-siloxane by heating at temperatures of about 150° C.–300° C. for a sufficient time to effect the desired conversion to the polyimide structure and final cure.

A preferred curing cycle for materials of the above general formula is as follows:
(a) from 15 to 30 minutes of from 135° C. to 150° C. in dry $N_2$.
(b) from 15 to 60 minutes at about 185° C.±10° C. in dry $N_2$.
(c) from 1 to 3 hours at about 225° C. in vacuum.
(d) from 10 to 15 minutes at about 450° C. in nitrogen.

Alternately, it has been found that one may be able to cure the coating material in other atmospheres such, for example, as air, for ease of commercial application of this invention.

Should an additional layer of the material be required to achieve a desired thickness of the cured layer, it is preferably applied after the first curing step (a). More than one additional layer can be applied in this manner with a subsequent curing step (a) after each new layer of silicone-polyimide copolymer material is applied to the previous layer. The final curing steps (b), (c) and (d) are then practiced.

In order to describe the invention more distinctly, I will describe the novel method of patterning the cured copolymer material on the surface of a semiconductor device. In particular, with reference to FIGS. 1 through 6, a body 10 of semiconductor material of N-type conductivity having opposed major surfaces 12 and 14 is processed to form regions 16 and 18 of P and N type conductivity respectively therein. P-N junctions 20 and 22 are formed at the abutting, contiguous surfaces of the regions 16 and the body 10 and regions 16 and 18, respectively. End portions of the P-N junctions 16 and 18 are exposed at the surface 12.

The material of the body 10 may be silicon, silicon carbide, germanium, gallium arsenide, a compound of a Group III element and a Group V element and a compound of a Group II element and a Group VI element.

In order to illustrate the novel process of this invention the material of the body is said to be of silicon.

An electrical contact 24 is affixed to the region 16 and is in ohmic electrical contact therewith. An ohmic electrical contact 26 is affixed to the region 18. Ohmic contacts 24 and 26 are typically made of aluminum. A layer 28 of the cured silicone-polyimide copolymer material is disposed on the surface 12 and the contacts 24 and 26. Although the thickness of the layer 28 may be of the order of 10 microns or more, a thickness of from 1 to 5 microns is preferred.

A layer 30 of silicon is vapor deposited upon the layer 28 of cured silicone-polyimide copolymer material preferably from a source of high purity silicon. A thickness of from 500Å to 2,000Å of the layer 30 has been found to be satisfactory as a suitable mask for selective plasma chemical etching of the material of the layer 28. Preferably, the layer 30 is of the order of 1000Å in thickness.

Employing photolithographical techniques, a layer 32 of a photoresist material is disposed on the layer 30 of silicon. Typically, the photoresist material is a positive material such, for example, as OFPR-2 from Tokyo Ohka America, Inc. The photoresist is pre-cured by 15 minutes of air drying at room temperature followed by baking at 90° C., approximately for a period of about 30 minutes in nitrogen. A suitable mask, not shown, is disposed on the photoresist layer 32, properly aligned in order that the windows to be opened in the silicone-polyimide material layer 28 are oriented properly with respect to contacts 24 and 26. The masked layer 32 of photoresist is exposed to ultraviolet radiation for the proper length of time. Developing of the exposed layer 32 removes unfixed photoresist material from the window areas 36 and 38 of the layer 32. The remainder of the material of the layer 32 is "fixed". The exposed layer 32 may be post cured by 140° C. bake for 30 minutes in order to enhance its adhesion to the silicon layer.

Figure 2:
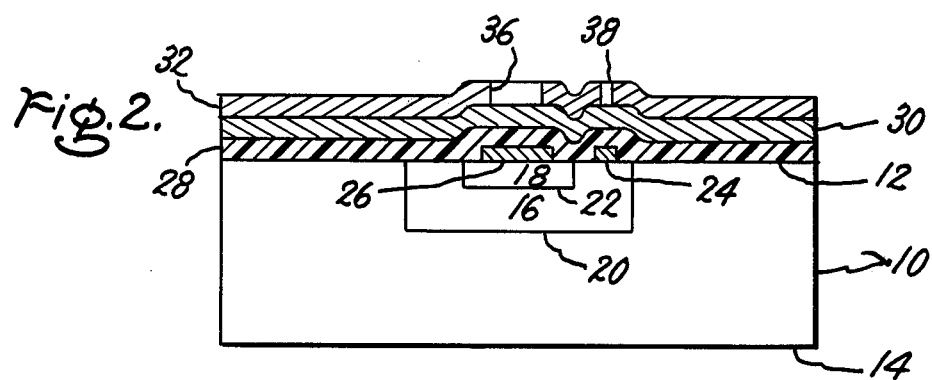
Figure 3:
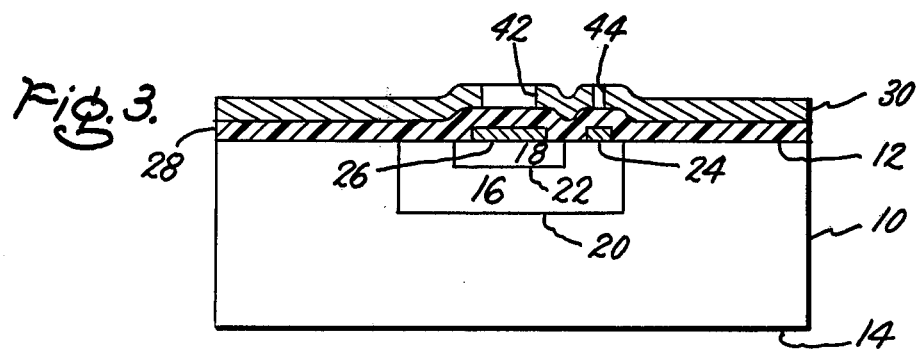

Windows 36 and 38 now expose selective surface areas of the layer 30 of silicon therein. The structure is as shown in FIG. 2.

The processed wafer 10 is placed in a suitable plasma etching machine, not shown, such for example, as an IPC series 4000, manufactured by International Plasma Corporation. The processed wafer 10 is placed in the work chamber of the plasma etching machine and the chamber is then evacuated. The processed wafer 10 is preheated in the chamber in a nitrogen plasma formed at an RF power of a range from about 100 watts to about 200 watts of energy and from 0.5 torr to 0.6 torr for a period of about 3 minutes to bring the temperature of the processed body 10 to about 75° C. and the nitrogen plasma is turned off. The preheating step is practiced to bring the body 10 up to the reaction temperature required for etching in a most uniform manner. The desired reaction temperature ranges from 65° C. to 85° C.

After preheating the body 10, $CF_4$ including 4% oxygen by volume at a gas flow rate of from about 100 cc/minute to about 150 cc/minute is introduced and a plasma is formed at an energy level of about 100 watts. The pressure in the chamber is typically about 0.3 to 0.5 torr. This new plasma is employed to etch the exposed silicon layer 30 at a rate of from about $0.5 \times 10^3$ Å to about $1 \times 10^3$ Å per minute. Plasma etching is practiced for a sufficient time to remove the exposed silicon, or for about one to two minutes, to assure complete removal of the silicon to open windows 42 and 44 (FIG. 3) in the silicon to expose selected surface areas of the silicon-polyimide copolymer material therein.

Figure 4:
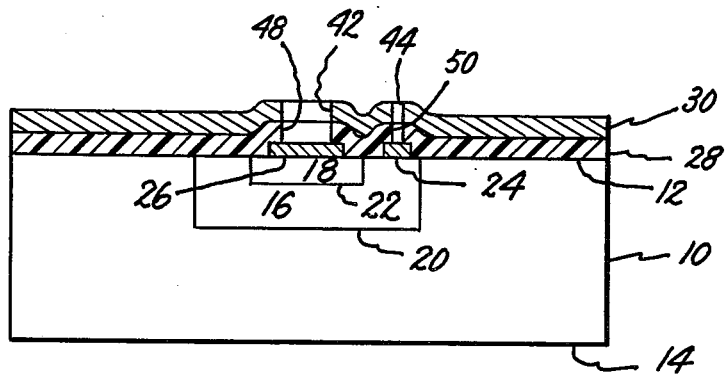

Upon completing the silicon etch step, the previous plasma of $CF_4$ and oxygen is stopped. A new plasma of oxygen is initiated. The RF power is from about 200 watts to about 400 watts. About 300 watts is preferred. The gas flow rate is about 300 CCPM of oxygen to obtain a chamber pressure of preferably about 1.6 torr. However, the chamber pressure may range from about 0.8 torr to 2.0 torr. These conditions for the plasma are sufficient to etch away the exposed silicone-polyimide material exposed in the windows 42 and 44 of the silicon mask 32. The etch rate of the polyimide-silicone copolymer material is from 0.25 to 0.5 micron per minute under the stipulated conditions. Simultaneously, the oxygen plasma strips away the photoresist of the mask layer 32. Removal of the silicone-polyimide material produces windows 48 and 50 to expose the electrical contacts 26 and 24 therein as shown in FIG. 4.

Undercutting of the silicone-polyimide material of the layer 30 is not a serious problem because of the long mean-free-path of the reactant species.

Figure 5:
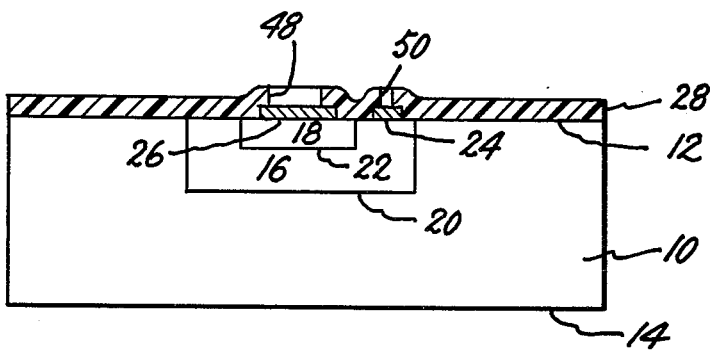

Upon completion of the etching of the polyimide-silicone copolymer material and the remainder of the photoresist mask, the plasma is turned off. The chamber is evacuated and a new plasma is formed, the composition being $CF_4$ and oxygen, the same as initially formed for etching the windows in the silicon layer 30. The remainder of the material of the silicon mask layer 30 is removed by the plasma etchant in about one minute. The plasma is turned off, the chamber brought again to atmospheric pressure and the processed body 10 removed from the chamber. The processed body 10 is as shown in FIG. 5.

The processed body may then be further cleaned by aqueous solutions if necessary.

Figure 6:
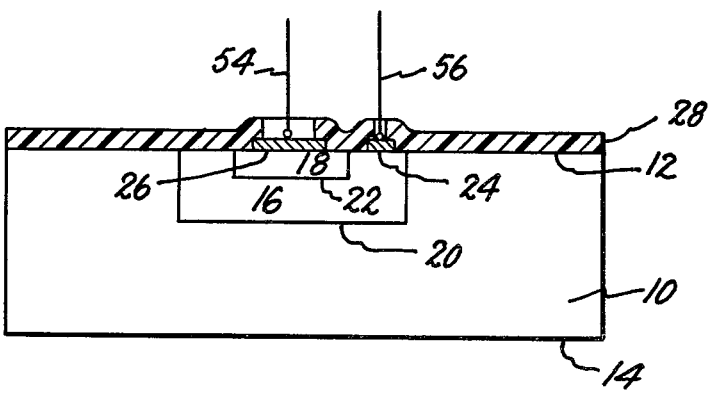

The body 10 may now be processed further as required by affixing electrical leads 54 and 56 to the respective electrical contacts 26 and 24 as illustrated in FIG. 6.

The process as described does not attack the exposed surface area of aluminum contacts 24 and 26 at any time. However, any exposed areas of silicon on the body 10 will be etched by an amount closely related to the thickness of the masking layer 30.

To illustrate the teachings of this invention several wafers of silicon semiconductor material, each about 2 inches in diameter, were processed to form a plurality of devices in each wafer. Aluminum metal was deposited on predetermined surface areas of the devices.

A polymer precursor solution was formed by reacting benzophenone tetracarboxylic acid dianhydride with methylene dianiline and bis (α-aminopropyl)tetramethyldisiloxane, the latter two diamine materials being present in the molar ratio of 70:30. The reaction was carried out at a temperature of less than 50° C. and using suitably purified and dried materials to favor a large molecular weight polymer. A solution of the polymer precursor in the form of the polyamic acid form dissolved in N-methyl-2-pyrrolidone containing 25% solids by weight was disposed on the surface of the devices. About 7 to 10 drops of the precursor solution was disposed on the surface of the wafers, and therefore the devices. The wafers were then spun at from about 2000 RPM to about 3000 RPM for 20 seconds. The coated wafers were cured at 150° C.±5° C. for about 30 minutes in Nitrogen, 185° C.±5° C. in Nitrogen for about 30 minutes, at 225° C.±5° C. in a vacuum of 29"

Hg for about 2 hours and at 450° C.±5° C. in nitrogen for ten minutes. The layer of copolymer material was from 1.5 to 2.0 microns in thickness when cured.

A layer of silicon, about 1000 Å in thickness, was deposited from a high purity source in an electron beam evaporator. A layer of positive photoresist material was disposed on the silicon layer and processed to open windows therein. The processed wafer was placed in an IPC series 4000 plasma etching machine. The wafer was preheated in a nitrogen plasma at 100 watts and 0.5 torr for 3 minutes.

The exposed portions of the silicon layer in the windows of the photoresist material were etched by a plasma consisting of $CF_4$ with 4% oxygen (100 CCPM) at 100 watts and a total pressure of about 0.3 torr. The elapsed etching time for the silicon was one minute. The plasma was turned off and the chamber was evacuated.

An oxygen plasma was then established at 300 watts of RF power, 300 CCPM of oxygen at a pressure of about 1.6 torr. The polyimide-silicone copolymer exposed in the silicon windows was etched in 5 minutes. The remaining photoresist material was removed simultaneously during the etching of the copolymer material. After etching of the polyimide-silicone copolymer material was completed, the plasma was turned off and evacuated.

$CF_4$, 4% oxygen plasma was again established at 100 watts RF power and about 0.3 torr. The new plasma was employed to etch the remaining silicon material of the mask from the copolymer material. Etching of the silicon was completed in one minute. The plasma was turned off and the chamber was brought back to atmospheric pressure. The processed body was removed and examined.

The exposed aluminum contact surface did not show any sign of attack by the plasma etchants. The windows were well defined and had dimensional stability. The edges of the copolymer material were not visibly undercut.

It has been further discovered that the addition of from about 10% by volume to about 15% by volume of $CF_4$ to the oxygen plasma greatly increases the etch rate of the copolymer material without any significant attack of the silicon masking layer. The advantages derived from this etch rate enhancement lie in the ability to use lower RF power levels, of the order of 50 watts, and lower ambient pressures, of the order of 0.2 torr, for etching copolymer material. Additionally, larger wafer loads can be handled for each production run. Furthermore, operating at the reduced pressure and power levels lends itself to a more uniform etching of the wafer as well as improving dimensional control of the etched openings in the copolymer material.

I claim as my invention:

1. A method for the selective chemical etching of a cured layer of a silicone-polyimide copolymer material disposed on a surface of a body to open windows therein to expose selected surface portions of the surface thereat including the process steps of:
   (a) forming a layer of a cured silicone-polyimide copolymer material on a processed body of semiconductor material, the copolymer material consisting of a reaction product of a silicon-free organic diamine, an organic tetracarboxylic dianhydride and a polysiloxane which when cured has the recurring structural units of the formula:

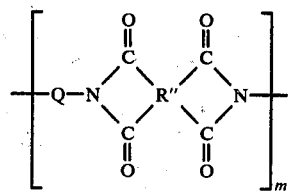

with from 5 to 40 mol percent intercondensed structural units of the formula:

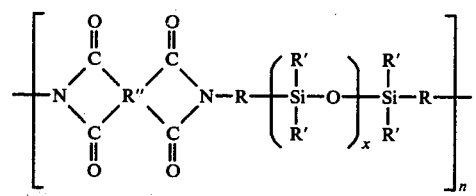

wherein
R is a divalent hydrocarbon radical;
R' is a monovalent hydrocarbon radical;
R" is a tetravalent organic radical;
Q is a divalent silicon-free organic radical which is the residue of an organic diamine;
x is an integer having a value of 1–4, and
m and n are integers greater than 1;
   (b) depositing a layer of silicon of a predetermined thickness on the layer of silicone-polyimide copolymer material;
   (c) depositing a photoresist material on the layer of silicon;
   (d) processing the layer of photoresist material to open one or more windows therein to expose a selected surface area of the layer of silicon thereat;
   (e) chemically etching selectively the exposed silicon in a plasma of $CF_4$/4% oxygen at about 100 watts RF power at a pressure range of from about 0.3 torr to about 0.5 torr to open one or more windows therein, aligned with the respective windows in the layer of photoresist, to expose selected surface areas of the layer of silicone-polyimide copolymer material thereat, and
   (f) chemically etching the layer of silicone-polyimide copolymer material selectively in an oxygen plasma at a range of RF power from about 200 watts to about 400 watts at a range of pressure from about 0.8 torr to about 2.0 torr to open one or more windows in the copolymer layer, aligned with the respective windows of the layer of silicon, to expose the selected surface areas of the surface of the processed body thereat.

2. The method of claim 1 wherein
the photoresist material is removed simultaneously with the plasma etching of the polyimide-silicone copolymer material.

3. The method of claim 1 wherein
the layer of silicon is from about 500 Å to about 2,000 Å in thickness.

4. The method of claim 3 wherein
the depositing of the layer of silicon is by electron beam deposition.

5. The method of claim 3 wherein
the layer of silicon is about 1000 Å in thickness.

6. The method of claim 5 wherein the depositing of the layer of silicon is by electron beam deposition.

7. The method of claim 1 and including the additional process step prior to process step (e) of selective etching of the exposed silicon of
preheating the processed body in a plasma of nitrogen for a sufficient period of time to raise the temperature of the processed body to about that temperature required for uniform plasma chemical etching of the silicon.

8. The method of claim 7 wherein
the nitrogen plasma is formed at an RF power of about 100 watts at a pressure of about 0.5 torr, and
the processed body is heated to a temperature ranging from 65° C. to 85° C.

9. The method of claim 1 wherein
the flow of the $CF_4$ containing 4% oxygen by volume is from about 100 cc per minute to about 150 cc per minute.

10. The method of claim 1 wherein
the oxygen gas flow of the oxygen plasma is about 300 CCPM.

11. The method of claim 10 wherein
the RF power is about 300 watts, and
the pressure is about 1.6 torr for the oxygen plasma.

12. The method of claim 8 wherein
the chemical etching of the exposed silicon is practiced at a pressure of about 0.3 torr and
the exposed polyimide-silicone copolymer material is chemically etched by a plasma of oxygen formed at a RF power of about 300 watts at a pressure of about 1.6 torr.

13. The method of claim 12 wherein
the flow of plasma gas of $CF_4$ containing 4% oxygen by volume is from about 100 cc/minute to about 150 cc/minute, and
the flow of oxygen gas for the oxygen plasma is about 300 CCPM.

14. The method of claim 1 and including
introducing from 10% by volume to 15% by volume of $CF_4$ into the oxygen of the oxygen plasma.

15. The method of claim 14 wherein
the oxygen plasma is formed at about 50 watts and about 0.2 torr pressure.

16. The method of claim 1 wherein
the chemical etching of the exposed silicon is practiced at a pressure of about 0.3 torr.

* * * * *